United States Patent
Yang et al.

(10) Patent No.: US 8,890,106 B2
(45) Date of Patent: Nov. 18, 2014

(54) HYBRID CIRCUIT OF NITRIDE-BASED TRANSISTOR AND MEMRISTOR

(71) Applicant: Hewlett-Packard Development Company, L.P., Houston, TX (US)

(72) Inventors: Jianhua Yang, Palo Alto, CA (US); Gilberto Medeiros Ribeiro, Palo Alto, CA (US); Byung-Joon Choi, Los Altos, CA (US); Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 98 days.

(21) Appl. No.: 13/718,689

(22) Filed: Dec. 18, 2012

(65) Prior Publication Data

US 2014/0166957 A1    Jun. 19, 2014

(51) Int. Cl.
*H01L 29/02* (2006.01)
*H01L 27/04* (2006.01)
*H01L 21/77* (2006.01)

(52) U.S. Cl.
CPC .............. *H01L 27/04* (2013.01); *H01L 21/77* (2013.01)
USPC ..... 257/2; 257/3; 257/4; 257/5; 257/E29.002; 257/314; 438/102; 438/103; 438/104; 438/682; 365/163; 365/148

(58) Field of Classification Search
CPC ......... H01L 45/04; H01L 29/00; H01L 27/24; G11C 13/0004
USPC .......... 257/2–5, E29.005, 314; 438/102–104, 438/382; 365/163, 148
See application file for complete search history.

(56) References Cited

U.S. PATENT DOCUMENTS

| | | | |
|---|---|---|---|
| 8,089,097 B2 | 1/2012 | D'Evelyn et al. | |
| 2008/0176366 A1 | 7/2008 | Mita et al. | |
| 2011/0266605 A1* | 11/2011 | Strukov et al. | 257/314 |
| 2011/0267870 A1* | 11/2011 | Fiorentino et al. | 365/148 |
| 2012/0202334 A1* | 8/2012 | Kochergin | 438/382 |

FOREIGN PATENT DOCUMENTS

WO    WO-2010151844    12/2010

OTHER PUBLICATIONS

Kim, D.J. et al., "A Kondo Insulating Memristor", Applied Physics Letters, Jul. 6, 2012, vol. 101, No. 1, 3 pages.
Miao, Feng, et al. "Continuous Electrical Tuning of the Chemical Composition of TaO x-Based Memristors," ACS nano 6.3 (2012): 2312-2318.

* cited by examiner

*Primary Examiner* — Jami M Valentine
(74) *Attorney, Agent, or Firm* — David W. Collins

(57) ABSTRACT

A hybrid circuit comprises a nitride-based transistor portion and a memristor portion. The transistor includes a source and a drain and a gate for controlling conductance of a channel region between the source and the drain. The memristor includes a first electrode and a second electrode separated by an active switching region. The source or drain of the transistor forms one of the electrodes of the memristor.

19 Claims, 7 Drawing Sheets

700

Provide a nitride-based transistor
705

↓

Form a memristor on the transistor, with the source or drain of the transistor forming one of the electrodes of the memristor
710

HYBRID CIRCUIT OF NITRIDE-BASED TRANSISTOR AND MEMRISTOR

BACKGROUND

Memristors are devices that can be programmed to different resistive states by applying a programming energy, for example, a voltage. After programming, the state of the memristor can be read and remains stable over a specified time period. Large crossbar arrays of memristive elements can be used in a variety of applications, including non-volatile solid state memory, programmable logic, signal processing, control systems, pattern recognition, and other applications.

DETAILED DESCRIPTION

Figure 1:
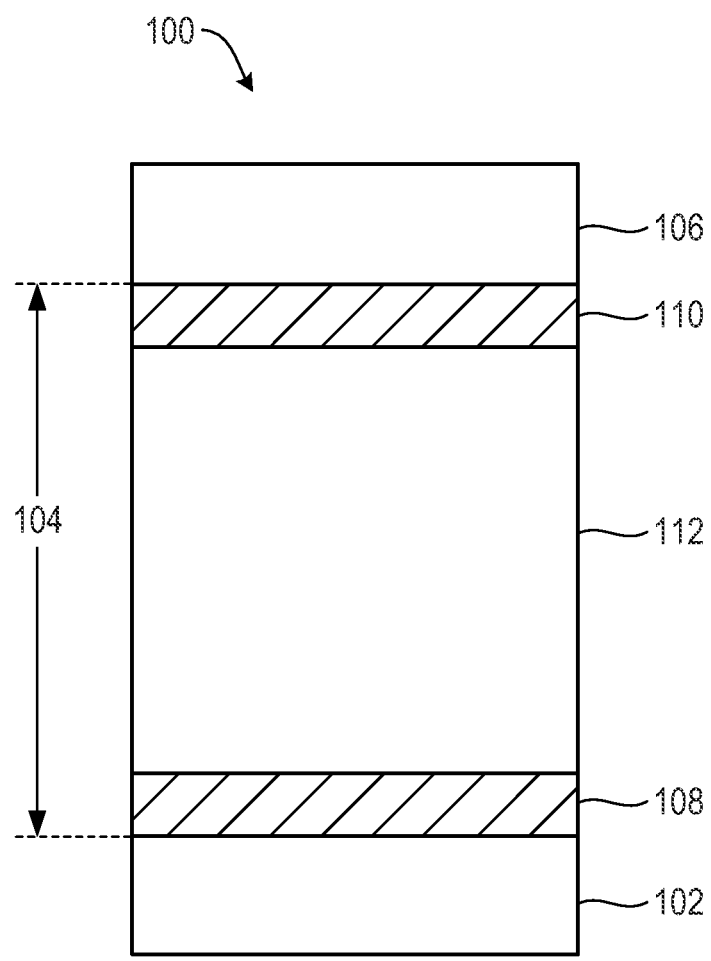
FIG. 1 is a cross-sectional view of an example memristor employed in the practice of the teachings herein.

Reference is now made in detail to specific examples of the disclosed nitride-based memristor and specific examples of ways for creating the disclosed nitride-based memristor. When applicable, alternative examples are also briefly described.

As used in the specification and claims herein, the singular forms "a," "an," and "the" include plural referents unless the context clearly dictates otherwise.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Memristors are nano-scale devices that may be used as a component in a wide range of electronic circuits, such as memories, switches, radio frequency circuits, and logic circuits and systems. In a memory structure, a crossbar of memristors may be used. When used as a basis for memories, the memristor may be used to store a bit of information, 1 or 0. When used as a logic circuit, the memristor may be employed as configuration bits and switches in a logic circuit that resembles a Field Programmable Gate Array, or may be the basis for a wired-logic Programmable Logic Array.

When used as a switch, the memristor may either be a closed or open switch in a cross-point memory. During the last few years, researchers have made great progress in finding ways to make the switching function of these memristors behave efficiently. For example, tantalum oxide ($TaO_x$)-based memristors have been demonstrated to have superior endurance over other nano-scale devices capable of electronic switching. In lab settings, tantalum oxide-based memristors are capable of over a trillion switching cycles whereas other memristors, such as tungsten oxide ($WO_x$)-based or titanium oxide ($TiO_x$)-based memristors, may require a sophisticated feedback mechanism for avoiding over-driving the devices or an additional step of refreshing the devices with stronger voltage pulses in order to obtain an endurance in the range of 10 million switching cycles.

Memristor devices may comprise two electrodes sandwiching an insulating layer. One or more conducting channels in the insulating layer between the two electrodes may be formed that are capable of being switched between two states, one in which the conducting channel forms a conductive path between the two electrodes ("ON") and one in which the conducting channel does not form a conductive path between the two electrodes ("OFF").

A memristor is illustrated in FIG. 1. In one example, the memristor may be an oxide-based memristor, while in another example, the memristor may be a nitride-based memristor. In either case, the memristor may be a stack of first electrode/active region/second electrode. In the case of an oxide-based memristor, the active region may be, for example, tantalum oxide ($TaO_x$), tungsten oxide ($WO_x$) or titanium oxide ($TiO_x$). In the case of a nitride-based memristor, the active region may be a stack of TiN/AlN/TiN. In another example, the nitride-based memristor may be a stack of TiN/AlN/Al, or TaN/GaAlN/Al. A high endurance, large ON/OFF ratio, low cost, and CMOS compatibility may be attained.

The device 100 comprises a bottom, or first, electrode 102, an active region 104, and a top, or second, electrode 106. By an "oxide-based" memristor is meant a memristor in which the active region is formed from an oxide material. By a "nitride-based" memristor is meant a memristor in which at least the active region 104 is formed from a nitride-containing composition. The electrodes 102, 106 may or may not be nitrides. However, in some examples, the electrodes 102, 106 are both formed from a nitride-containing composition, as described more fully below. Much of the discussion which follows is directed to nitride-based memristors. However, it will be understood than oxide-based memristor may be employed in the practice of the teachings herein.

The active region 104 may comprise an insulating metal nitride, such as AlN or any III-N material, such as GaN and InN. The electrodes 102 and 106 may comprise a conducting metal nitride, such as TiN, as described above. As used herein, "insulating" and "conducting" are relative terms; for example, the electrodes 102, 106 are more conducting than the active region 104, in some examples, by at least one order of magnitude.

In an example, the bottom electrode 102 may be titanium nitride (TiN) having a thickness of 100 nm. The active region 104 may be insulating nitrides, such as aluminum nitride (AlN), which may be in thermodynamic equilibrium with a nitride electrode, such as TiN. TiN has a large N solubility, which makes it a candidate memristive electrode material. AlN has a large bandgap and only two solid phases in the Al—N system, both of which make AlN a candidate memristive switching material. In this example, the active region may have a thickness of 12 nm. The top electrode 106 may also be TiN having a thickness of 100 nm.

In some examples, the switching function of the memristor 100 is achieved in the switching layer 104. In general, the active region 104 is a weak ionic conductor that is semiconducting and/or insulating without dopants. These materials can be doped with native dopants, such as nitrogen vacancies or impurity dopants (e.g., intentionally introducing different metal ions into the active region 104). The resulting doped materials are electrically conductive because the dopants are electrically charged and mobile under electric fields. Accordingly, the concentration profile of the dopants inside the active region 104 can be reconfigured by electric fields, leading to the resistance change of the device under electric fields, namely, electrical switching.

Continuing to refer to FIG. 1, the active region 104 may include one or two switching phases, shown here as layers 108, 110, and a conductive layer 112, formed of a dopant source material. The switching layers 108, 110 may each be formed of a switching material capable of carrying a species of dopants and transporting the dopants under an applied potential. The conductive layer 112 may be disposed between and in electrical contact with the switching layers 108, 110. Conductive layer 112 may be formed of a dopant source material that includes the species of dopants that are capable of drifting into the switching layers under the applied potential and thus changing the conductance of memristive element 100. In some examples, only switching layer 108 may be present; in other examples, only switching layer 110 may be present, and in still other examples, both switching layers 108 and 110 may be present, all depending on the specific requirements on the current-voltage characteristics of the devices 100. In some cases, nitride layers of 102 and 106 may serve as the dopant source materials and the conductive layer 112 may not comprise a dopant source material.

Other nitride materials may be used in place of AlN as the active region 104. Examples of such materials include, but are not limited to, nitrides of trivalent elements, such as BN, GaN, and InN, as well as nitrides of metals that have a maximum valence of three and form semiconducting nitrides, such as ScN, YN, LaN, NdN, SmN, EuN, GdN, DyN, HoN, ErN, TmN, YbN, and LuN. Other semiconducting compounds arise when the total valence of the element complements that of nitrogen for form-filled valence shells, for example, with $Si_3N_4$, $Ta_3N_5$, and $Ge_3N_4$, as well as other hyper-stoichiometric nitrides, such as $NbN_{(1+x)}$, $Hf_3N_4$, and $Zr_3N_4$. In addition, ternary nitrides, such as $Ga_xAl_{1-x}N$, can also be used as the switching nitride materials. The electrically conductive portion 112 of such active region 104 may comprise $AN_{1-x}$, where A may be B, Ga, In, Sc, Y, La, Nd, Sm, Eu, Gd, Dy Ho, Er, Tm, Yb, or Lu and the value of x may be less than 0.2, or $Si_3N_{4-x}$ or $Ge_3N_{4-x}$, where the value of x may be less than 1, or $Ta_3N_{5-x}$, where the value of x may be less than 2. In addition, superior memristor performance may be obtained by using alloys of the above-mentioned compounds with each other or with other nitrides not explicitly mentioned, in any combination. Further, new properties and superior performance can be obtained by using heterostructures composed of multiple layers of different nitrides and/or alloys.

Other nitride materials may be used in place of TiN as the electrodes 102, 106. Examples of such materials include, but are not limited to, the metallic mononitride compounds of non-trivalent transition metals, such as tantalum nitride (TaN), hafnium nitride (HfN), zirconium nitride (ZrN), chromium nitride (CrN), and niobium nitride (NbN), as well as metallic or semimetallic nitrides such as tungsten nitride ($WN_2$), molybdenum nitride ($Mo_2N$), and iron nitrides ($Fe_2N$, $Fe_3N$, $Fe_4N$, and $Fe_{16}N_2$), as well as alloys thereof, such as ternary nitrides. Further, alloys of these nitrides with other metal nitrides (e.g., AlN) may also be employed to form ternary alloys such as TiAlN. The electrodes 102, 106 may each be composed of the same material or different materials.

In some examples, a switching channel (not shown) may be formed. In an example, the switching channel may be formed by heating the active region 104. Heating can be accomplished using many different processes, including thermal annealing or passing an electrical current through the memristor 100. In other examples, wherein a forming-free memristor with built-in conductance channels is used, no heating may be required as the switching channels are built in, and the application of a first voltage, which may be approximately the same as the operating voltage, to the virgin state of the memristor 100 may be sufficient for forming a switching channel.

When a potential is applied to memristive element 100 in a first direction (such as in the positive z-axis direction), one of the switching layers (a first switching layer) develops an excess of the dopants and the other switching layer (a second switching layer) develops a deficiency of the dopants. When the direction of the potential is reversed, the voltage potential polarity is reversed, and the drift direction of the dopants is reversed. The first switching layer develops a deficiency of dopants and the second switching layer develops an excess of dopants.

In the device depicted in FIG. 1, at least portions of the active region 104 may be made electrically conductive by introducing nitrogen vacancies therein. The dopant species, namely, nitrogen vacancies $V_N$, diffuses under an electric field (that may be assisted by Joule heating). In those portions, the metal nitride is in a nitrogen-deficient state, represented (in the case of AlN) as $AlN_{1-x}$, where x denotes the nitrogen deficiency from AlN. In some examples, the value of x may be less than 0.2. In other examples, the value of x may be less than 0.02.

Conditions for improved device performance have been identified. These conditions may include (1) thermal stability between the matrix and channels; (2) thermal stability between the electrode(s) and the switching material; and (3) a reservoir for mobile species (O vacancies for oxide-based memristors and N vacancies for nitride-based memristors).

Thus, a nitride-based memristor may include, as one example, TiN (electrode 102)/AlN (active region 104) with electrically conductive portion(s) $AlN_{1-x}$ (112)/TiN (electrode 106), or, more simply, $TiN/AlN—AlN_{1-x}/TiN$. The TiN has a large solubility for N, making it a suitable electrode serving as a reservoir and sink of N vacancies. AlN has only two stable solid phases (like Ta—O, another material commonly used in memristors). AlN is a large bandgap insulator, leading to a large ON/OFF conductance ratio, as well as decreasing leakage current and therefore parasitic resistance. The $TiN/AlN—AlN_{1-x}/TiN$ system is thermally stable and no thermal reaction occurs due to electrical heating, which may adversely change the device states. Finally, based on the foregoing items, this system may have great endurance, on the order of at least billions of switching cycles.

Likewise, in another example, a nitride-based memristor may comprise TiN (electrode 102)/GaN (active region 104) with electrically conductive portion(s) AlGaN$_{1-x}$ (112)/TiN (electrode 106), or, more simply, TiN/AlGaN—AlGaN$_{1-x}$/TiN.

Gallium nitride (GaN) HEMTs (High Electron Mobility Transistors) have been offered commercially since 2006, and have found immediate use in various applications due to their high frequency and high voltage operation. It has recently been demonstrated that memristors can also be operated at very high frequency (>10 GHZ). However, in order to operate memristor at this speed, high voltage is needed, which is higher than what traditional Si transistors can provide, especially when their size is scaled further down in the future.

In accordance with the teachings herein, such high voltage can be provided to the memristor via a GaN HEMT. Specifically, integration of GaN HEMTs with memristors allows high speed operations. Based on a recent demonstration of memristive switching from nitride materials, this integration is quite easy to implement and is cost-efficient. It may take only one extra step to fabricate a memristor on a GaN HEMT, namely, adding a memristor electrode contact next to the GaN HEMT source or drain contact. In addition to high frequency, both GaN and memristors can sustain harsh environments that cause traditional transistors and memories to fail. An example of such harsh environments includes high temperatures, which also support the integration of nitride memristors with GaN HEMTs. Both oxide-based memristors and nitride-based memristors may be integrated with nitride-based transistors.

A high electron mobility transistor (HEMT), also known as heterostructure FET (HFET) or modulation-doped FET (MODFET), is a field effect transistor (FET) incorporating a junction between two materials with different band gaps (i.e., a heterojunction) as the channel instead of a doped region, as is generally the case for MOSFET. A commonly used material combination is GaAs with AlGaAs, though there is wide variation, dependent on the application of the device. Devices incorporating more indium generally show better high-frequency performance, while in recent years, gallium nitride HEMTs have attracted attention due to their high-power performance. HEMT transistors are able to operate at higher frequencies than ordinary transistors, up to millimeter wave frequencies, and are used in high frequency products such as cell phones, satellite television receivers, and radar equipment. A HEMT is a specific case of an FET, and indeed, the teachings herein may be applied to all varieties of FETs.

Figure 2:
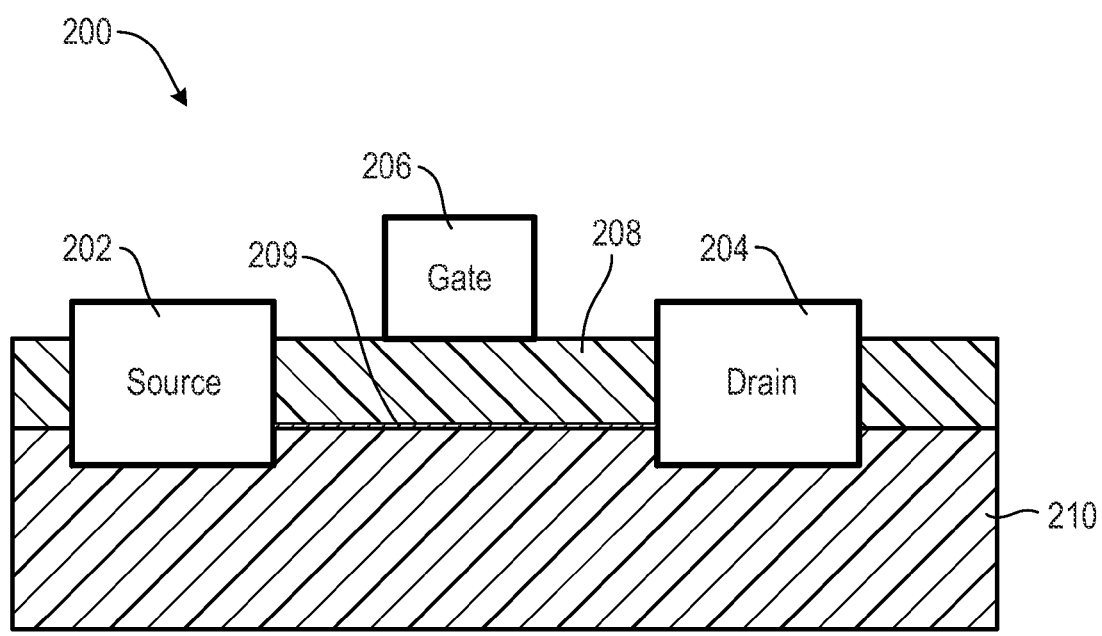
FIG. 2 is a cross-sectional view of an example nitride-based high electron mobility transistor (HEMT) employed in the practice of the teachings herein.

FIG. 2 shows an example of a HEMT 200 that may be employed in the practice of these teachings. The HEMT 200 may include source 202 and drain 204, separated and spaced apart from a gate 206. An insulator layer 208 supports the gate 206. The source 202 and drain 204 extend into a buffer layer 210, which also supports the insulator layer 208. A channel layer 209 that extends from the source 202 to the drain 204 is formed at the interface of the insulating layer 208 and the buffer layer 210. The channel layer 209 supports a two-dimensional electron gas. HEMTs utilize the heterojunction (209) between two semiconducting materials (208, 210) to confine electrons to a triangular quantum well. The gate 206 controls the conductance of the channel region 209 between the source 202 and drain 204. The insulator 208 can be GaN, AlGaN or some other material, such as Si$_3$N$_4$ or an oxide of AlGaN, for example.

It will be appreciated that there are many variations in HEMT structures, but FIG. 2 depicts a basic structure 200 that will serve the purposes of illustration. By a "nitride-based" HEMT is meant a HEMT in which at least the channel layer 208 is formed from a nitride-containing composition. The other components (source 202, drain 204, gate 206, and buffer layer 210 each may or may not be nitrides. However, in some examples, the drain 202, source 204, gate 206, and buffer layer 210 are all formed from a nitride-containing composition, as described more fully below.

In a conventional GaN HEMT 200, the source 202 and drain 204 may be a metal, such as Al or TiN or W, Au, Ta, Ni, Co, Cu, Pt, Mo, Nb, Cr, or other common metal. The gate 206 may also be a metal, such as listed immediately above or a heavily doped semiconductor, such as heavily doped Si or a heavily doped GaN, heavily doped GaAlN, or metallic compounds, such as TiN, TaN, HfN, ZrN, HfN, for example. The channel 208 may be a nitride, such as GaN, or a mixed III-nitride, such as AlGaN. The buffer layer 210 may be the converse of the channel layer 208, namely, a mixed III-nitride or a nitride. The buffer layer may alternatively be SiO$_2$.

In many cases, the source 202, drain 204 and gate 206 may each be metals or a multilayer of metals, such as Ti/Au. The metal materials may or may not be the same for each of the source 202, the drain 204, and the gate 206.

Figure 2A:
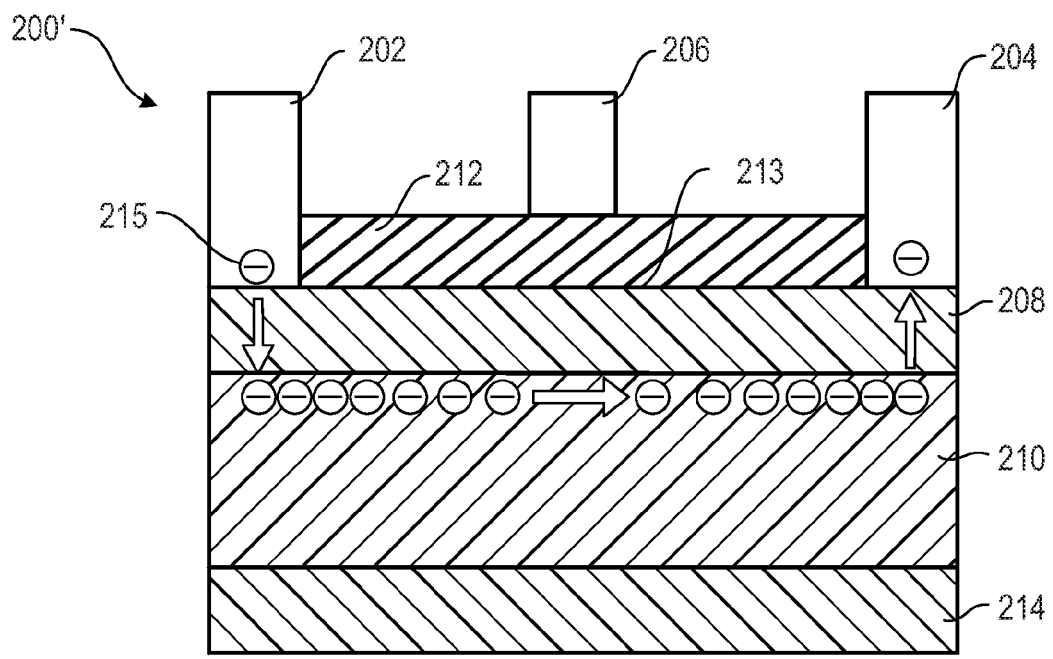
FIGS. 2A and 2B are each example variations of the HEMT depicted in FIG. 2.
Figure 2B:
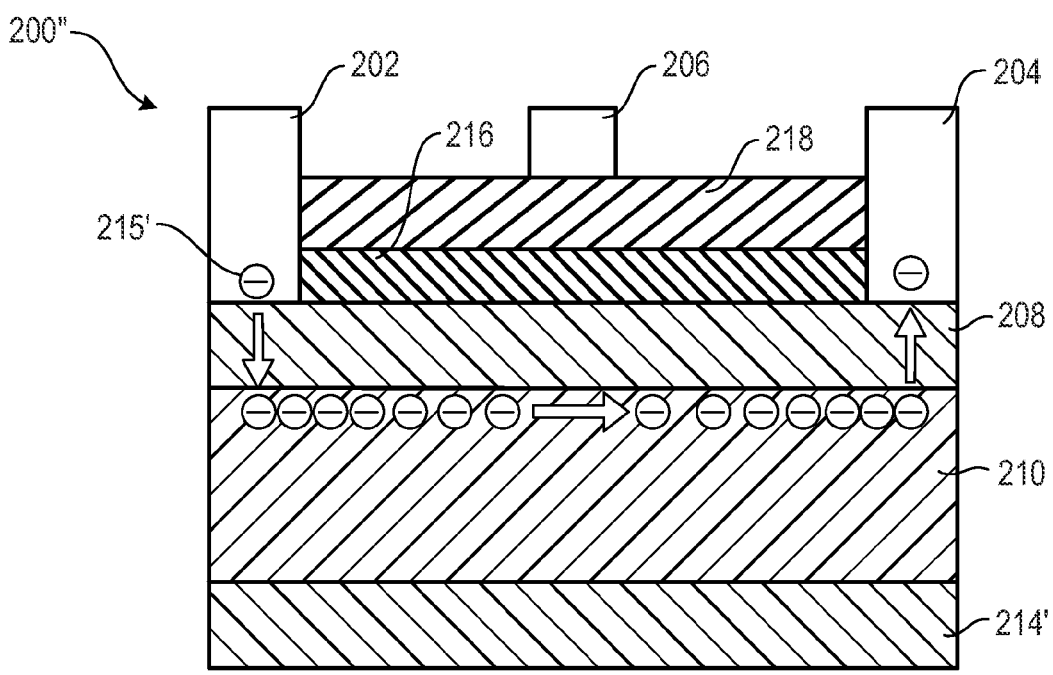

As mentioned above, there are many variations of the HEMT structure. Two such variations are shown in FIGS. 2A and 2B, both involving insulated-gate structures 200', 200". In the device 200' shown in FIG. 2A, the gate 206 is separated from the insulating layer 208 by an insulator layer 212. For example, the insulating region 208 may comprise AlGaN and the insulator region 212 may comprise an oxidation product of AlGaN beneath the gate 206 in the region of the interface 213. Charge carriers (electrons) 215 move from the source 202 to the drain 204 through the interface between layers 208 and 210 or the channel layer 210, which may be GaN. A substrate 214 supports the channel layer 210.

In the device 200" shown in FIG. 2B, the gate 206 may be separated from the insulating region 208 by Si$_3$N$_4$ layer 218. Between insulating layer 208 (formed of n-type AlGaN) may be a layer 216 of n-type GaN. Charge carriers (a two-dimensional electron gas) 215' move from the source 202 to the drain 204 through the interface between layers 208 and 210 or the channel layer 210, which may be GaN. A semi-insulating substrate 214', such as SiC, supports the channel layer 210.

Figure 3:
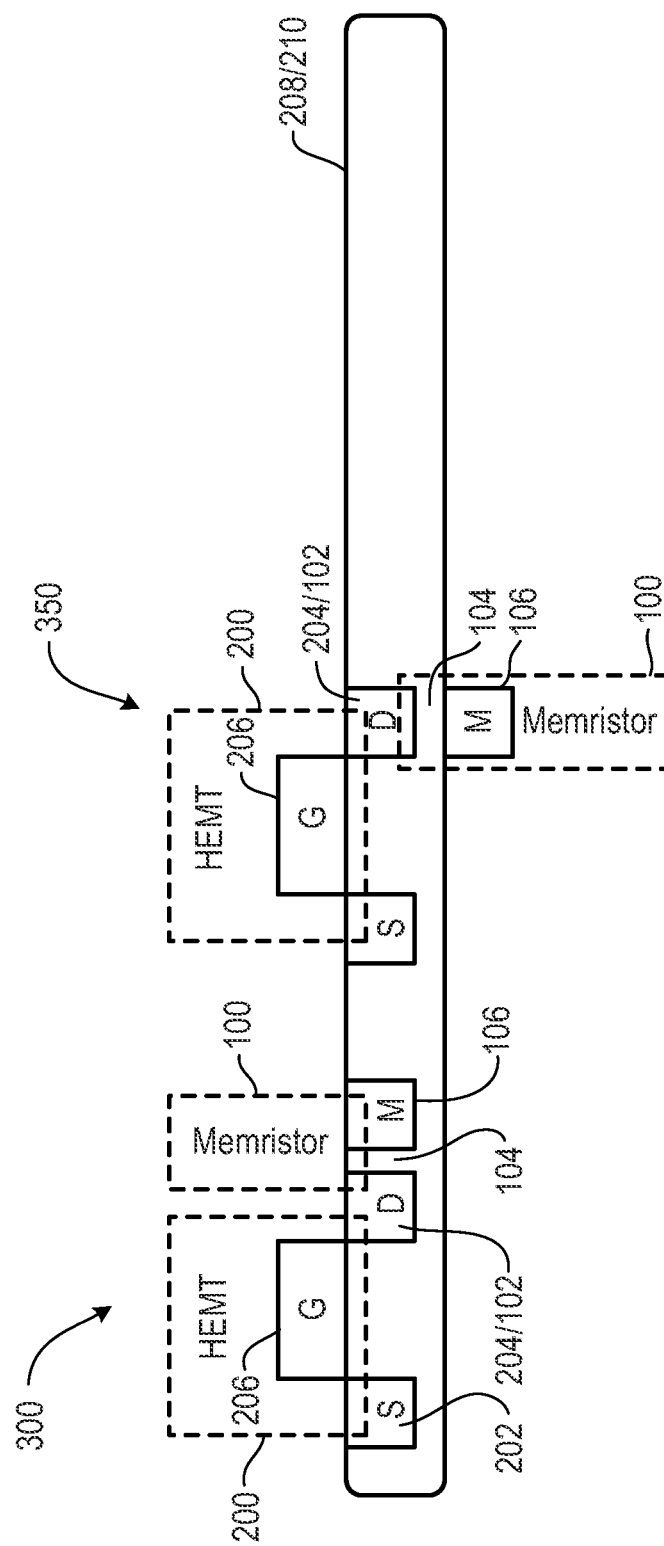
FIG. 3 is a cross-sectional view of example circuit structures combining a nitride-based HEMT and a nitride-based memristor.

In accordance with the teachings herein, a memristor and a nitride-based transistor, such as a HEMT, may be combined to form a circuit that provides high frequency operation of memristors (both HEMT and memristor >10 GHz) and a high temperature memory circuit. In an example, a nitride-based memristor and a nitride-based HEMT may be so combined. Using the source 204 or drain 202 of the HEMT 200 as one electrode, a nitride-based memristor 100 may be formed by simply adding another electrode (e.g., Al, Ti, TiN, etc.) either horizontally or vertically. FIG. 3 depicts both a horizontal configuration 300 and a vertical configuration 350. In other words, the memristor may be placed right on the transistor, using the same materials.

As depicted in FIG. 3, for the horizontal configuration 300, a nitride-based memristor 100 is formed by adding another metal electrode 106 near a source 204 or drain 202 (as shown here), spaced apart by the desired thickness of the active region 104.

For the vertical configuration 350, a nitride-base memristor 100 is also formed by adding another metal electrode 106, here, vertically spaced from a source 204 or drain 202 (as shown in FIG. 3), again, spaced apart by the desired thickness of the active region 104.

This is a completely different configuration than past combinations of field effect transistors (FETs) and memristors. In those cases, the memristor structure is built on the gate material (e.g., gate 206) of the transistor. In such cases, the memristor is in series with the gate and can thus shift the threshold gate voltage of the transistor.

In the present case, a memristor structure (or more than one) is built on the source or drain materials of the transistor (using the source or drain material as one of the electrode of the memristor). Therefore, the memristor is in series with the transistor, specifically, a HEMT, and more generally, an FET. The memristor may not modify the property of the transistor, but rather the transistor may control the memristor switching in terms of applied voltage and current on the memristor.

In the FET-memristor integration, a separate memristive switching layer, such as a Ta oxide layer, may be employed in order to form a memristor with a transistor. In the present teachings, the memristive switching layer shares the same material as the HEMT channel and therefore no separate switching layer may be needed in order to form the memristor. Both the transistors and the memristors use nitrides as their functioning materials. In the transistor, GaN and GaAlN are used and therefore the transistors are the so-call HEMTs (high electron mobility transistors). In the memristors, GaN, AlN, or GaAlN are used as the switching materials. The advantages of integrating the nitride memristors and HEMTs include ultra-high speed (both HEMT and memristor >10 GHz); the HEMT may be used to enable the memristor to be fast speed (memristor speed exponentially increases with voltage); the combination may be used for high temperature operation (for both HEMT and memristors); it is easy to implement, and it is non-volatile. An example combination of a nitride-based HEMT and a nitride-based memristor permit achieving ultra-high speed and high temperature performance.

Figure 4A:
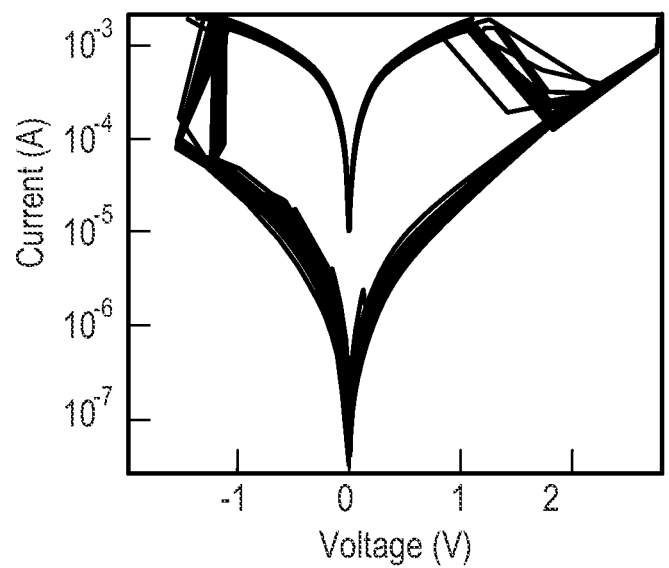
FIG. 4A, on coordinates of current (in A) and voltage (in V), is an I-V plot of switching current, where current is depicted on a logarithm scale.
Figure 4B:
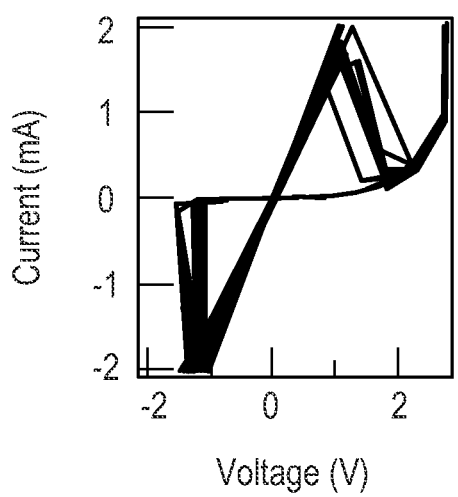
FIG. 4B, on coordinates of current (in mA) and voltage (in V), is an I-V plot of switching current for the device of FIG. 4A, but where current is depicted on a linear scale.

FIGS. 4A and 4B depict the switching behavior of a nitride-based memristor by itself with 100 consecutive cycles. This memristor was made up of Al 20 nm/AlN 10 nm/Pt 30 nm. FIG. 4A depicts the I-V curve, where current is on a logarithmic scale, for 100 consecutive semi-log I-V loops. FIG. 4B depicts the same data, but with current on a linear scale. Very repeatable switching with large ON/OFF conductance ratio can be seen from FIG. 4.

Figure 5A:
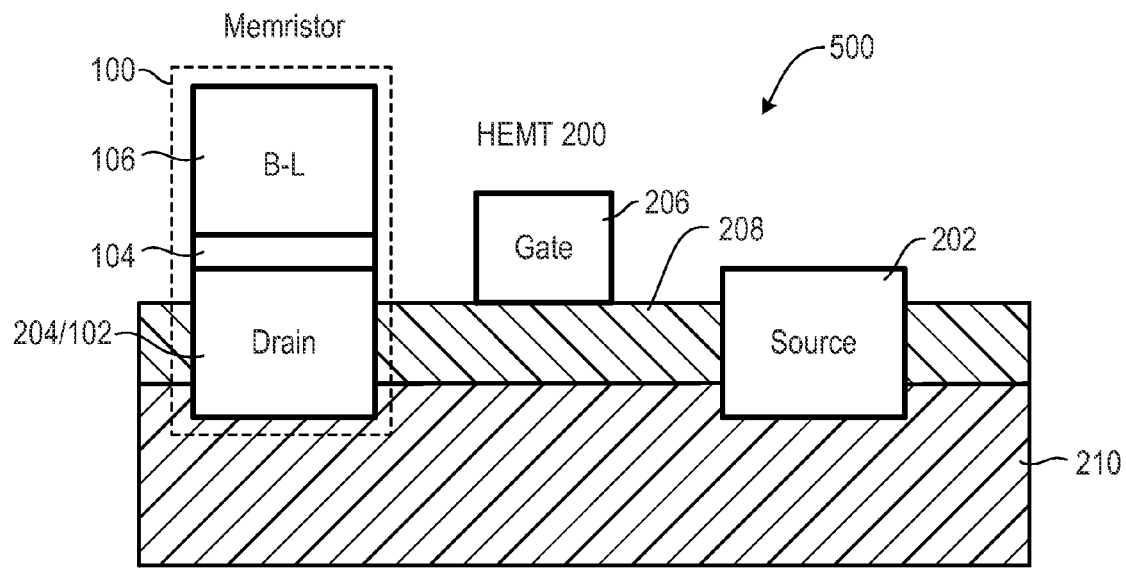
FIGS. 5A and 5B depict further cross-sectional views of examples of a combined nitride-based HEMT and a memristor.
Figure 5B:
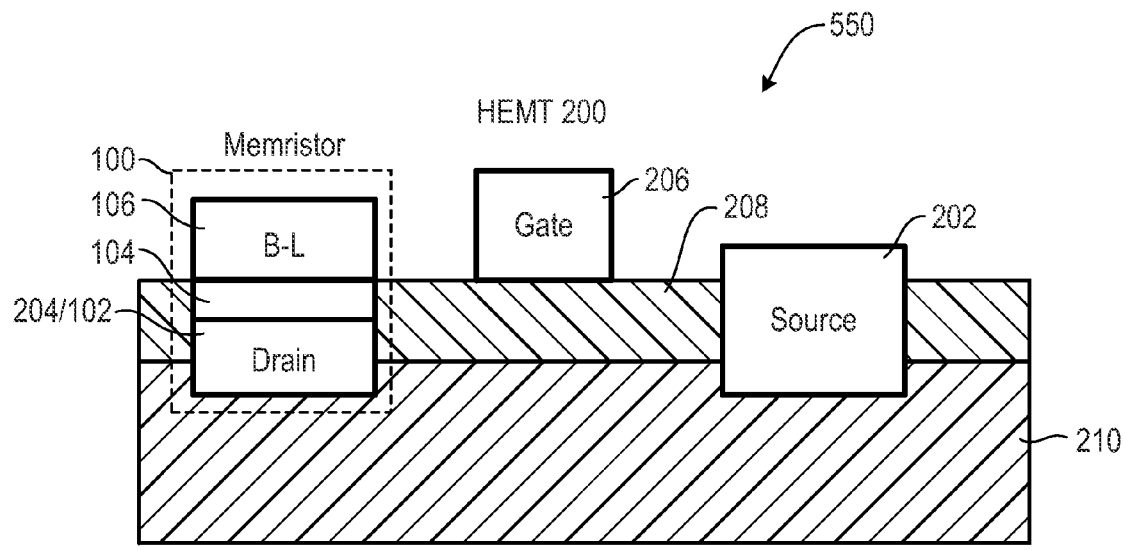

FIGS. 5A and 5B depict further examples of combinations of the nitride-based memristor and nitride-based HEMT, both showing vertical configurations. In FIG. 5A, the combination 500 of the nitride-based memristor 100 and nitride-based HEMT 200 involves forming a "B-L" (bit-line) as the upper electrode 106, while the drain 202 also serves as the bottom electrode 102. A bit-line may be used, for example, where an array of combined HEMT/memristor devices is employed, each connected to the bit-line as shown. The two electrodes 106, 102 are spaced apart by the active region 104. In this configuration, the composition of the active region may be different than that of the channel. It may be desired to have a different material forming the active region in order to provide a different switching property, depending on the application. In an example, the active region 104 may be an oxide instead of a nitride, thereby forming an oxide-based memristor.

In FIG. 5B, during formation of the HEMT device, the drain 202 (or source 204) is reduced in height prior to forming the channel layer, thus burying the drain (or source). The reduction in height permits using the channel material, such as AlGaN, as the active region, once the bit-line is formed on top of the channel, to form the combination 550 of the nitride-based memristor 100 and nitride-based HEMT 200. In an example, the active region 104 again may be an oxide instead of a nitride, thereby forming an oxide-based memristor.

There is a large range of chemical concentration and resistance that can be deterministically accessed within the nitride-based memristors, for which the state variable of the device is the concentration and distribution of the nitrogen vacancies. Under the control of HEMT, the N-vacancy concentration and distribution can be tuned. By driving the HEMT from the linear into the saturation regime, it may be possible to limit the current through the memristor, that is, implement current-compliance.

Figures 6, 7:
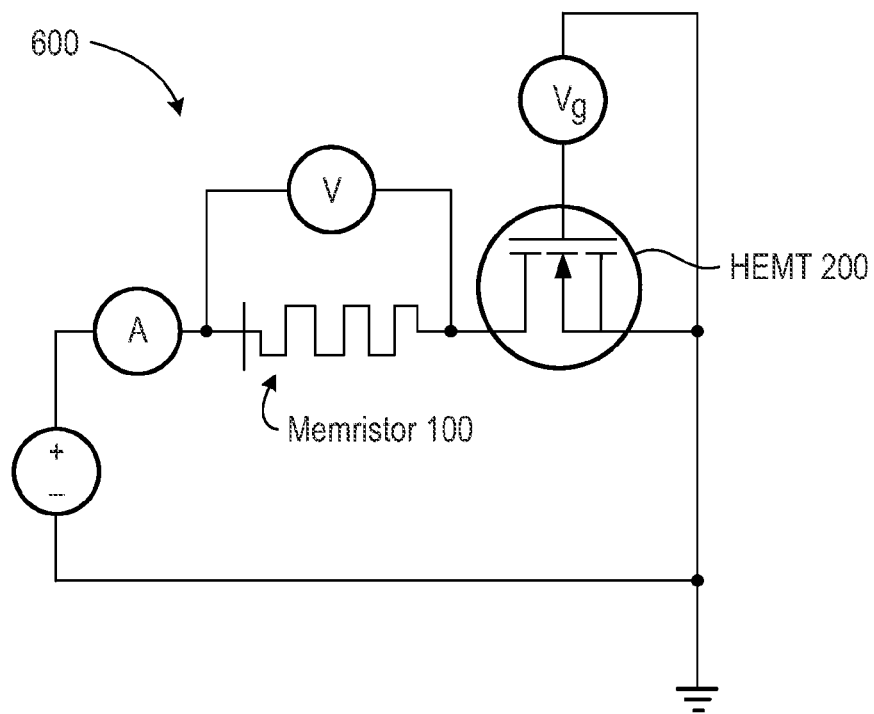
FIG. 6 is an example circuit diagram of a combined nitride-based HEMT and a nitride-based memristor.
FIG. 7 is a flowchart showing one illustrative method for manufacturing a hybrid circuit of a nitride-based transistor and a memristor, according one embodiment of principles described herein.

An example of a 1HEMT1M write circuitry 600 is shown in FIG. 6. A standard 4-probe setup may be used to switch the memristor 100 with a HEMT 200 connected in series. When the memristor 100 is positively biased, the maximum current flow in the circuit may be limited by the saturation current of the HEMT 200, controlled via gate voltage. When the memristor 100 is negatively biased, the HEMT 200 may serve simply as a series resistor. The operating parameters, including the current (e.g., 1 µA to 1 mA) and voltage levels (0.5 V to about 50 V), depend on the specific materials, device dimension, and the operation speed. More generally, the HEMT 200 may be replaced by an FET.

Other hybrid circuits comprising a nitride HEMT and a nitride memristor may also be envisioned, where the memristor is associated with the source or drain. Such hybrid circuits are considered to be within the scope of the teachings herein.

A method of forming a hybrid circuit comprising a transistor portion and a memristor portion is depicted in FIG. 7. The method 700 includes providing 705 a nitride-based transistor. The method 700 further includes forming 710 a memristor on the transistor, with the source or drain of the transistor forming one of the electrodes of the memristor. The memristor may be oxide-based or nitride-based.

The foregoing description has been primarily directed to the use of HEMT devices in combination with memristors, both oxide-based and nitride-based. However, it will be appreciated that a combination of a nitride transistor, such as any of the field effect transistors (FETs), including MESFETs (MEtal Semiconductor FETs), may also be used as well.

What is claimed is:

1. A hybrid circuit comprising a nitride-based transistor portion and a memristor portion, in which:
the transistor includes a source and a drain and a gate for controlling conductance of a channel region between the source and the drain: and
the memristor includes a first electrode and a second electrode separated by an active switching region,
wherein the source or drain of the transistor forms one of the electrodes of the memristor,
wherein the nitride-based transistor comprises a high electron mobility transistor (HEMT) and the active region of the memristor is nitride-based.

2. The hybrid circuit of claim 1 wherein the source and drain are laterally separated by the channel region,
wherein the channel region comprises a nitride-based composition or nitride heterostructure composition, and
wherein a portion of materials forming the channel region of the transistor serves as the active switching region of the memristor and the active region comprises a nitride-based composition or a nitride heterostructure composition.

3. The hybrid circuit of claim 1 wherein the HEMT portion and the memristor portion are in a horizontal configuration.

4. The hybrid circuit of claim 3 wherein the first electrode is formed laterally adjacent either the source or drain of the HEMT and spaced apart therefrom to define the active region of the memristor, the source or drain comprising the second electrode of the memristor.

5. The hybrid circuit of claim 1 wherein the HEMT and the memristor are in a vertical configuration.

6. The hybrid circuit of claim 5 wherein the first electrode is formed vertically adjacent either the source or drain of the HEMT and spaced apart therefrom to define the active region of the memristor, the source or drain comprising the second electrode of the memristor.

7. The hybrid circuit of claim 5 wherein the first electrode is spaced above the source or drain, where the active layer comprises either a portion of the channel region or a separately formed material, the source or drain comprising the second electrode of the memristor.

8. The hybrid circuit of claim 5 wherein the first electrode is placed on the opposite side of a layer supporting the source or drain, where the active layer comprises a portion of the layer supporting the source and drain, the source or drain comprising the second electrode of the memristor.

9. The hybrid circuit of claim 1 wherein for the HEMT portion:
the source, drain, and gate each independently comprise metals selected from the group consisting of, Ti, Al, Au, Cu, Ta, W, Nb, Ni, Co, Fe, Cr, Mo, Pt, and Ag, or metallic nitrides selected from the group consisting of TiN, TaN, HfN, ZrN, and WN; and
the channel region comprises GaN, AlGaN, InN, AlN or heterostructure of these layers.

10. The hybrid circuit of claim 1 wherein the source comprises Al, the drain comprises TiN, the gate comprises Ti/Au, the channel region comprises GaN/AlGaN, first electrode is the same as the source or drain, the second electrode comprises TiN, and the active region comprises AlGaN.

11. The hybrid circuit of claim 1 wherein for the memristor portion:
the first electrode and the second electrode each independently comprise metals selected from the group consisting of, Ti, Al, Au, Cu, Ta, W, Nb, Ni, Co, Fe, Cr, Mo, Pt, and Ag, or metallic nitrides selected from the group consisting of TiN, TaN, HfN, ZrN, and WN; and
either the active region includes an electrically semiconducting or nominally insulating and weak ionic switching based on a nitride phase selected from the group consisting of GaN, AlGaN, InN, AlN, or heterostructures of these layers or the active region includes an electrically semiconducting or nominally insulating and weak ionic switching based on an oxide phase.

12. A method of forming a hybrid circuit comprising a transistor portion and a memristor portion wherein the transistor portion includes a source and a drain and wherein the memristor includes a first electrode and a second electrode separated by an active region, the method comprising:
providing a nitride-based transistor; and
forming a memristor on the transistor, with the source or drain of the transistor forming one of the electrodes of the memristor,
wherein the transistor comprises a high electron mobility transistor (HEMT) portion and the active region of the memristor is nitride-based.

13. The method of claim 12 wherein the source and drain are laterally separated by a channel region, with a gate contacting the channel region between the source and drain,
wherein the channel region comprises a nitride-based composition, and
wherein a portion of materials forming the channel region of the transistor serves as the active switching region of the memristor and the active region comprises a nitride-based composition or a nitride heterostructure composition.

14. The method of claim 12 wherein the HEMT portion and the memristor portion are in a horizontal configuration.

15. The method of claim 14 wherein the first electrode is formed laterally adjacent either the source or drain of the HEMT and spaced apart therefrom to define the active region of the memristor, the source or drain comprising the second electrode of the memristor.

16. The method of claim 12 wherein the HEMT and the memristor are in a vertical configuration.

17. The method of claim 16 wherein the first electrode is formed vertically adjacent either the source or drain of the HEMT and spaced apart therefrom to define the active region of the memristor, the source or drain comprising the second electrode of the memristor.

18. The method of claim 16 wherein the first electrode is spaced above the source or drain, where the active layer comprises either a portion of the channel region or a separately formed material, the source or drain comprising the second electrode of the memristor.

19. The method of claim 16 wherein the first electrode is placed on the opposite side of a layer supporting the source or drain, where the active layer comprises a portion of the layer supporting the source and drain, the source or drain comprising the second electrode of the memristor.

* * * * *

UNITED STATES PATENT AND TRADEMARK OFFICE
CERTIFICATE OF CORRECTION

PATENT NO. : 8,890,106 B2  
APPLICATION NO. : 13/718689  
DATED : November 18, 2014  
INVENTOR(S) : Yang et al.

It is certified that error appears in the above-identified patent and that said Letters Patent is hereby corrected as shown below:

In the Claims

Column 8, line 47, Claim 1, delete "drain:" and insert -- drain; --, therefor.

Column 9, line 28, Claim 9, delete "AlGaN" and insert -- AlGaN --, therefor.

Column 9, line 28, Claim 9, delete "AlN" and insert -- AlN --, therefor.

Column 9, line 32, Claim 10, delete "AlGaN" and insert -- AlGaN --, therefor.

Column 9, line 34, Claim 10, delete "AlGaN" and insert -- AlGaN --, therefor.

Column 9, line 45, Claim 11, delete "AlGaN" and insert -- AlGaN --, therefor.

Column 9, line 45, Claim 11, delete "AlN" and insert -- AlN --, therefor.

Signed and Sealed this  
Ninth Day of June, 2015

Michelle K. Lee  
*Director of the United States Patent and Trademark Office*